US010903589B2

(12) United States Patent
Radosevic et al.

(10) Patent No.: US 10,903,589 B2
(45) Date of Patent: Jan. 26, 2021

(54) RADIO FREQUENCY OPTICAL ACOUSTIC COMMUNICATION MODEM

(71) Applicant: The United States of America as represented by the Secretary of the Navy, San Diego, CA (US)

(72) Inventors: Dusan Radosevic, San Diego, CA (US); Nghia Tran, San Diego, CA (US); Burton H. Neuner, III, San Diego, CA (US); Michael W. Pfetsch, San Diego, CA (US)

(73) Assignee: United States of America as represented by the Secretary of the Navy, Washington, DC (US)

(*) Notice: Subject to any disclaimer, the term of this patent is extended or adjusted under 35 U.S.C. 154(b) by 414 days.

(21) Appl. No.: 16/051,021

(22) Filed: Jul. 31, 2018

(65) Prior Publication Data

US 2020/0044371 A1 Feb. 6, 2020

(51) Int. Cl.
| | |
|---|---|
| *H01R 12/52* | (2011.01) |
| *H05K 7/14* | (2006.01) |
| *H01R 12/70* | (2011.01) |
| *H05K 1/02* | (2006.01) |
| *H05K 7/02* | (2006.01) |

(52) U.S. Cl.
CPC ......... *H01R 12/52* (2013.01); *H01R 12/7088* (2013.01); *H05K 1/0243* (2013.01); *H05K 1/0274* (2013.01); *H05K 7/026* (2013.01); *H05K 7/1457* (2013.01)

(58) Field of Classification Search
None
See application file for complete search history.

(56) References Cited

U.S. PATENT DOCUMENTS

| | | | |
|---|---|---|---|
| 9,853,742 B1 | 12/2017 | Radosevic et al. | |
| 2006/0167134 A1* | 7/2006 | Sato | C08G 63/88 523/148 |
| 2007/0035473 A1* | 2/2007 | Yamazaki | G09G 5/18 345/4 |
| 2011/0228945 A1* | 9/2011 | Mihelich | H04R 3/002 381/59 |
| 2013/0123591 A1* | 5/2013 | Naganuma | A61B 5/14532 600/316 |
| 2014/0126730 A1* | 5/2014 | Crawley | H04R 29/001 381/59 |
| 2014/0270207 A1* | 9/2014 | Vinayak | H04R 3/08 381/59 |

* cited by examiner

*Primary Examiner* — Xanthia C Cunningham
(74) *Attorney, Agent, or Firm* — Naval Information Warfare Center, Pacific; Kyle Eppele; Young Fei

(57) ABSTRACT

A device for communications comprising a power interconnect board, an acoustic board electrically connected to the processor board, a radio frequency board electrically connected to the processor board, and an optical board electrically connected to the power interconnect board.

20 Claims, 14 Drawing Sheets

RADIO FREQUENCY OPTICAL ACOUSTIC COMMUNICATION MODEM

FEDERALLY SPONSORED RESEARCH AND DEVELOPMENT

The Radio Frequency Optical Acoustic Communication Modem is assigned to the United States Government and is available for licensing and commercial purposes. Licensing and technical inquiries may be directed to the Office of Research and Technical Applications, Space and Naval Warfare Systems Center Pacific (Code 72120), San Diego, Calif., 92152 via telephone at (619) 553-2778 or email at ssc_pac_t2@navy.mil. Reference Navy Case 108101.

BACKGROUND OF THE INVENTION

1. Field of the Invention

The present invention relates to communications devices generally, and particularly to a modem capable of radio frequency, acoustic, and optical communications both above and below the ocean surface.

2. Description of the Related Art

Modems capable of communicating underwater exist. However, existing underwater modems are limited to a single communication method (such as via radio frequency, acoustic signals, or optical signals). Existing modems are also limited by the frequency and wavelength of the signal, the data throughput of the signal, and typically are limited to working in a single domain (such as either above or below the ocean surface).

SUMMARY OF THE INVENTION

The present invention is a device for communications comprising a power interconnect board, an acoustic board electrically connected to the processor board, an radio frequency board electrically connected to the processor board, and an optical board electrically connected to the power interconnect board.

BRIEF DESCRIPTION OF THE DRAWINGS

Throughout the several views, like elements are referenced using like elements. The elements in the figures are not drawn to scale, and some dimensions may be exaggerated for clarity.

DETAILED DESCRIPTION OF THE INVENTION

While this invention may be embodied in different forms, the drawings and this section describe in detail specific embodiments of the invention with the understanding that the present disclosure is to be considered merely a preferred embodiment of the invention, and is not intended to limit the invention in any way.

The present invention is a reconfigurable communications device capable of different methods of communications and is controlled by a common processor. It can be software defined and user programmable. It employs a flexible and versatile hardware platform, allowing it to work as either a single point of communication or in conjunction with other communications devices. The present invention is capable of real time signal processing, and may be used for communication both above and below the ocean surface. The present invention may utilize software which is user programmable and user defined.

Figure 1:
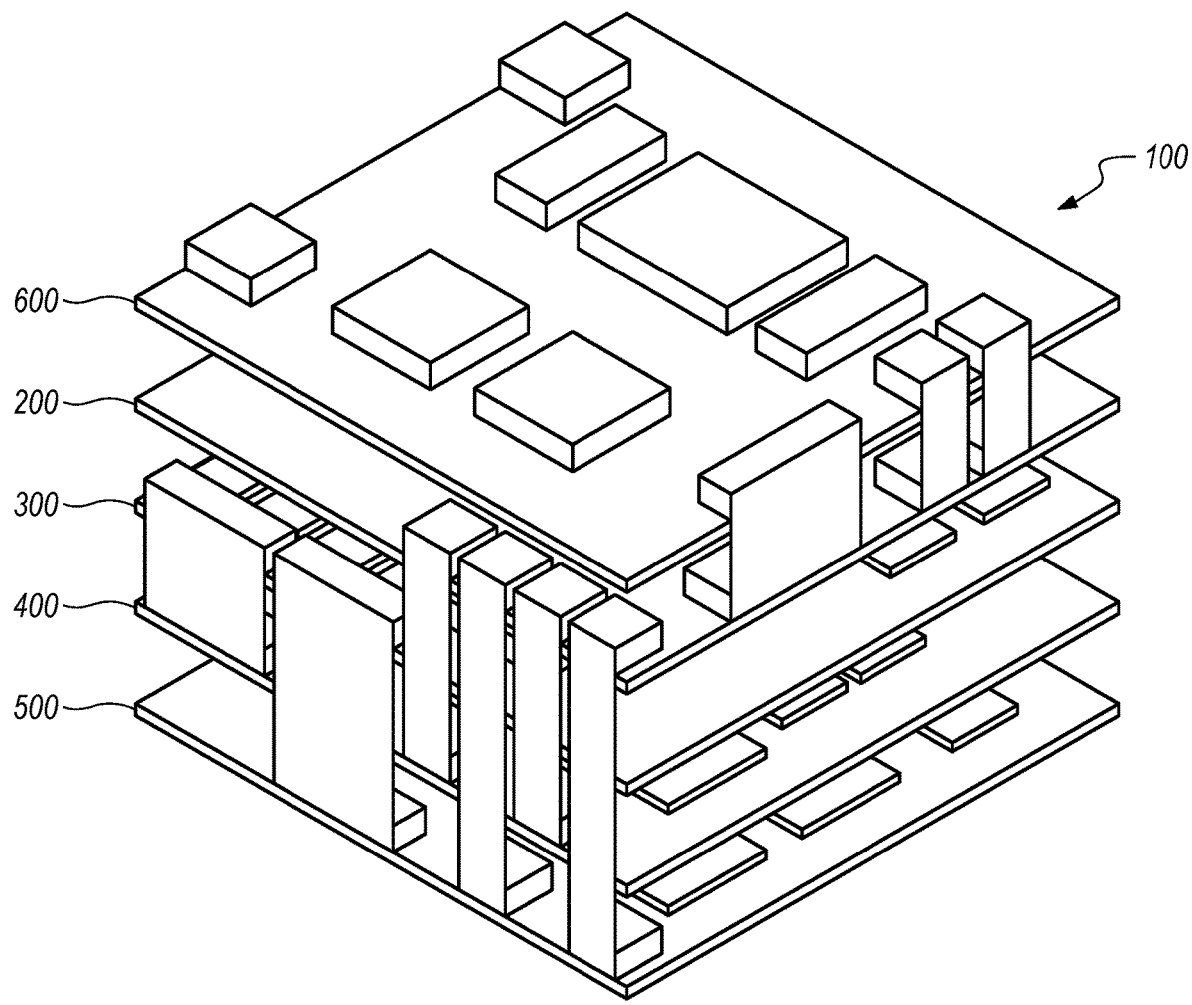
FIG. 1 is a front perspective view of an embodiment of the present invention.

The present invention consists of a digital back-end and multiple analog front-ends. FIG. 1 depicts the various component circuit boards of the present invention. The present invention will be able to support three different communications modalities by utilization of several different circuit boards: (1) acoustic communications utilizing an acoustic board 400; (2) radio frequency (RF) communications utilizing a radio frequency board 500; and (3) free-space optical communications utilizing an optical board 600. The main drivers and the majority of the processing will occur on a system on a chip (SoC) module 310 and microcontroller 313 functioning as a digital signal processor on a processor board 300.

Figure 4:
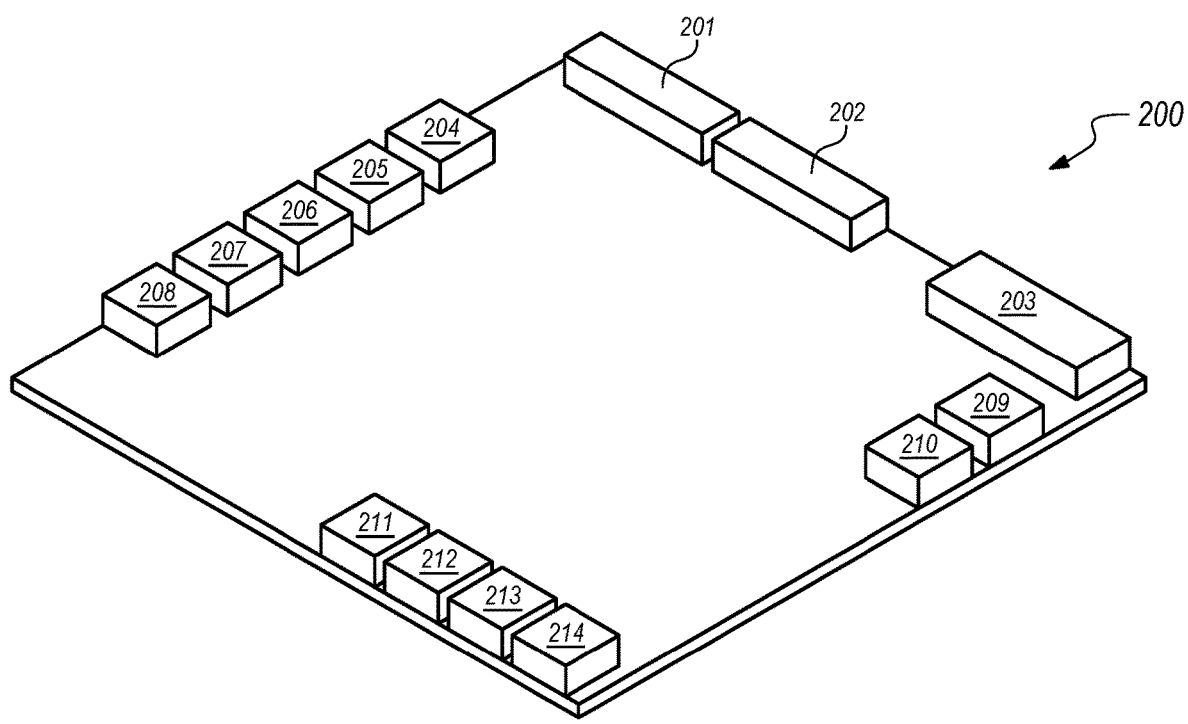
FIG. 4 is a top perspective view of a power interconnect board according to one embodiment of the present invention.

FIG. 1 depicts an embodiment of the present invention at a component level. Generally, the device for communications 100 comprises a power interconnect board 200, an acoustic board 400, a radio frequency board 500, and an optical board 600. FIG. 4 depicts the power interconnect board 200 in greater detail. The power interconnect board 200 further comprises a first stack connector 201 and second stack connector 202. The first stack connector 201 and second stack connector 202 may be rectangular 40-position elevated female socket connectors or some equivalent. The power interconnect board 200 also comprises a first optical power and control connector 203, which may be an 8-pin interconnect capable of transmitting and receiving power and control signals. The power interconnect board additionally comprises a first power in port 204, a first power out port 205, a first network port 206 (which may be an Ethernet type port), a first serial bus port 207 (which may be a Universal Serial Bus type port), and a first serial port 208. Additionally, the power interconnect board 200 comprises a first optical receiver port 209 capable of receiving a signal in and comprising a ground, as well as a first optical transmitter port 210 capable of transmitting a signal out and comprising a ground. The power interconnect board 200 further comprises a first power connector 211, a second power connector 212, a first acoustic transmitter connector 213 capable of transmitting acoustic transducer signals, and a first antenna connector 214 capable of transmitting RF antenna signals.

Figure 5:
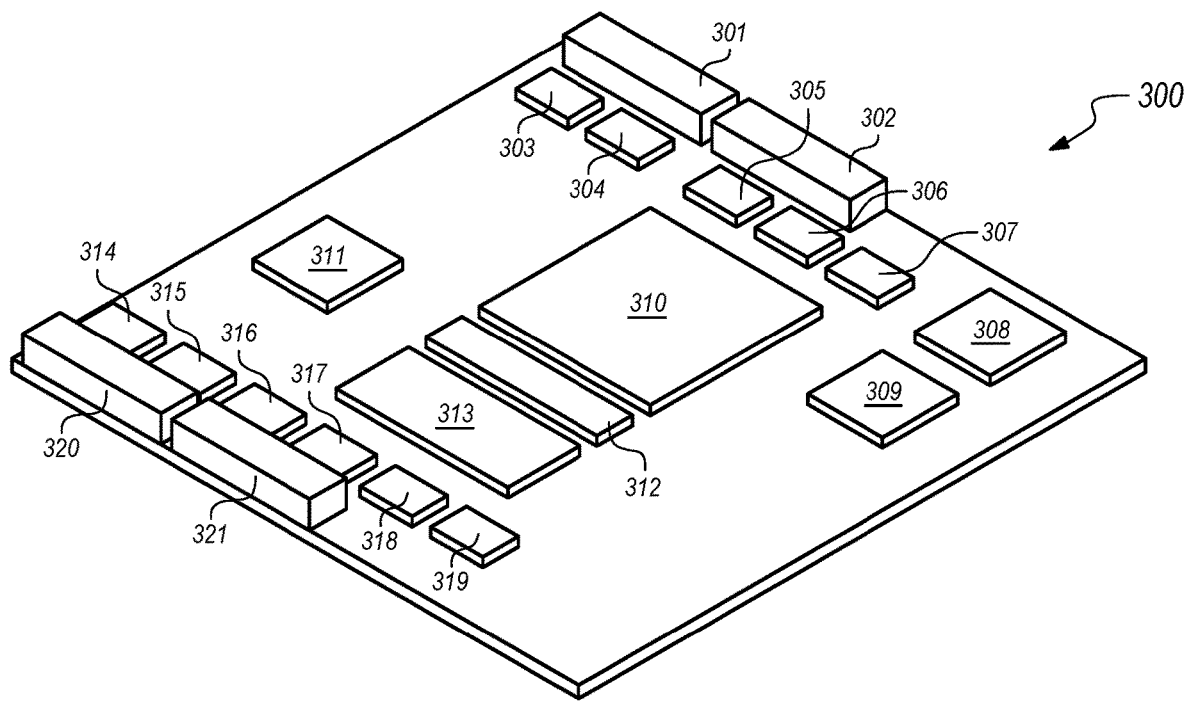
FIG. 5 is a top perspective view of a processor board according to one embodiment of the present invention.

The device for communications 100 further comprises a processor board 300, depicted in detail at FIG. 5. The processor board 300 comprises a third stack connector 301 and a fourth stack connector 302, which may be rectangular 40-position elevated female socket connectors or some equivalent. The processor board further comprises a first power regulator 303, a second power regulator 304, a second network port 305 (which may be an Ethernet type connection), a second serial port 306, and a first signal translator 307. The processor board 300 further comprises a first analog to digital converter 308, a first digital to analog converter 309, a system on chip module 310, a first operational amplifier 311, a second signal translator 312, a microcontroller 313, a third signal translator 314, a second analog to digital converter 315, a second digital to analog converter 316, a fourth signal translator 317, a third analog to digital converter 318, and a third digital to analog converter 319. Furthermore, the processor board 300 comprises a first acoustic signal and control bus 320 (which may be a 20-position flat parallel cable connector) and a first antenna signal and control bus (which may be a 20-position flat parallel cable connector).

Figure 6:
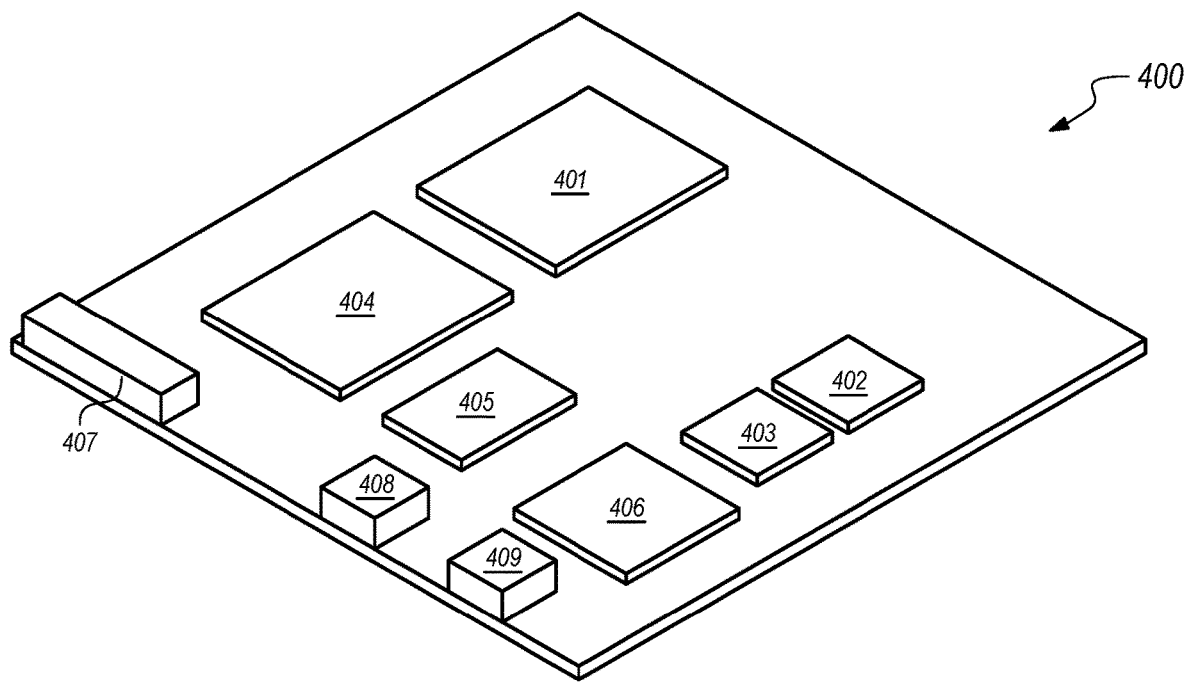
FIG. 6 is a top perspective view of an acoustic board according to one embodiment of the present invention.

The device for communications 100 further comprises an acoustic board 400, depicted in greater detail at FIG. 6. The acoustic board 400 comprises an acoustic programmable amplifier and gain control module 401, a first programmable gain amplifier 402, a first low noise amplifier 403, a first input output expander 404 (which may be a 16-channel general purpose input output expander), a fourth analog to digital converter 405, a first transmit receive switch 406, a second acoustic signal and control bus 407 (which may be a 20-position flat parallel cable connector), a third power connector 408, and a second acoustic transmitter connector 409 capable of transmitting acoustic transducer signals.

Figure 7:
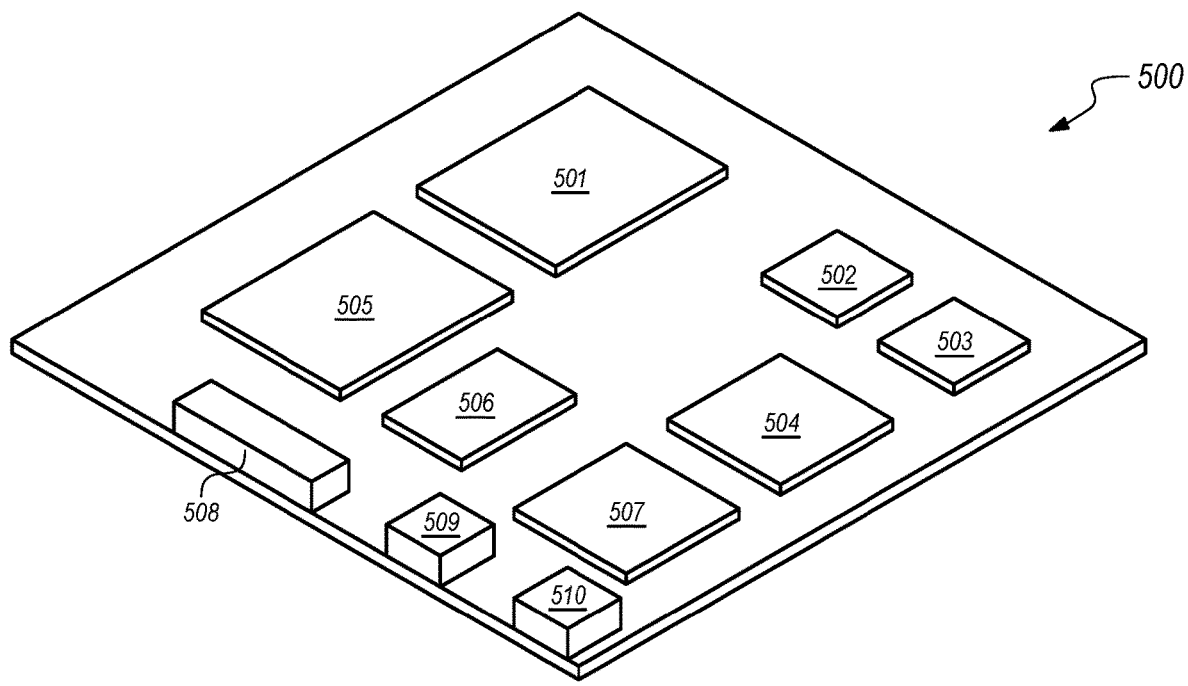
FIG. 7 is a top perspective view of an radio frequency board according to one embodiment of the present invention.

The device for communications 100 also comprises an radio frequency board 500, depicted in greater detail at FIG. 7. The radio frequency board 500 comprises a radio frequency programmable amplifier and gain control module 501, a second programmable gain amplifier 502, a second low noise amplifier 503, a second input output expander 505 (which may be a 16-channel general purpose input output expander), a fifth analog to digital converter 506, an frequency tuner 507, a second antenna signal and control bus 508 (which may be a 20-position flat parallel cable connector), a fourth power connector 509, and a second antenna connector 501 capable of transmitting RF antenna signals.

Figure 8:
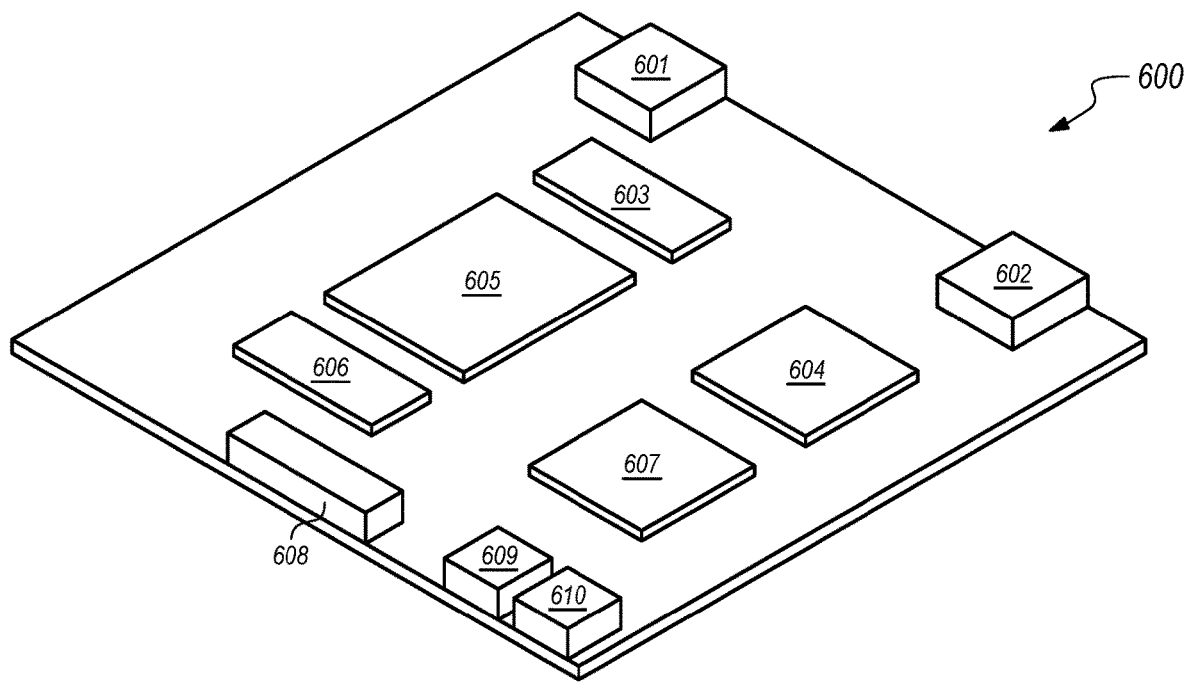
FIG. 8 is a top perspective view of an optical board according to one embodiment of the present invention.

The device for communications 100 additionally comprises an optical board 600, depicted in greater detail at FIG. 8. The optical board comprises a light emitting diode 601, a photodiode 602, an optical programmable amplifier and gain controller 603, a transimpedence and gain control amplifier 604, a third input output expander 605 (which may be a 16-channel general purpose input output expander), a sixth analog to digital converter 606, a third programmable gain amplifier 607, a second optical power and control connector 608 (which may be a 20-position flat parallel cable connector), a second optical receiver port 609 capable of receiving a signal in and comprising a ground, and a second optical transmitter port 610 capable of transmitting a signal out and comprising a ground.

FIG. 1 depicts connections from a frontal perspective view of the invention. FIG. 1 depicts an embodiment of the invention where the power interconnect board 200 is connected to the acoustic board 400 and the radio frequency board 500. The first power connector 211 is electrically connected to the third power connector 408, providing direct current power. The second power connector 212 is electrically connected to the fourth power connector, providing direct current power. The first acoustic transmitter connector 213 is electrically connected to the second acoustic transmitter connector 409, serving as an interconnect connecting an acoustic transducer with the acoustic board 400. The first antenna connector 214 is electrically connected to the second antenna connector 510, serving as an interconnect connecting an RF antenna with the radio frequency board 500. The power interconnect board 200 is also connected to the optical board 600. The first optical power and control connector 203 is electrically connected to the second optical power and control connector 608. The first optical receiver port 209 is electrically connected to the second optical receiver port 609, and the first optical transmitter port 210 is electrically connected to the second optical transmitter port 610.

Figure 2:
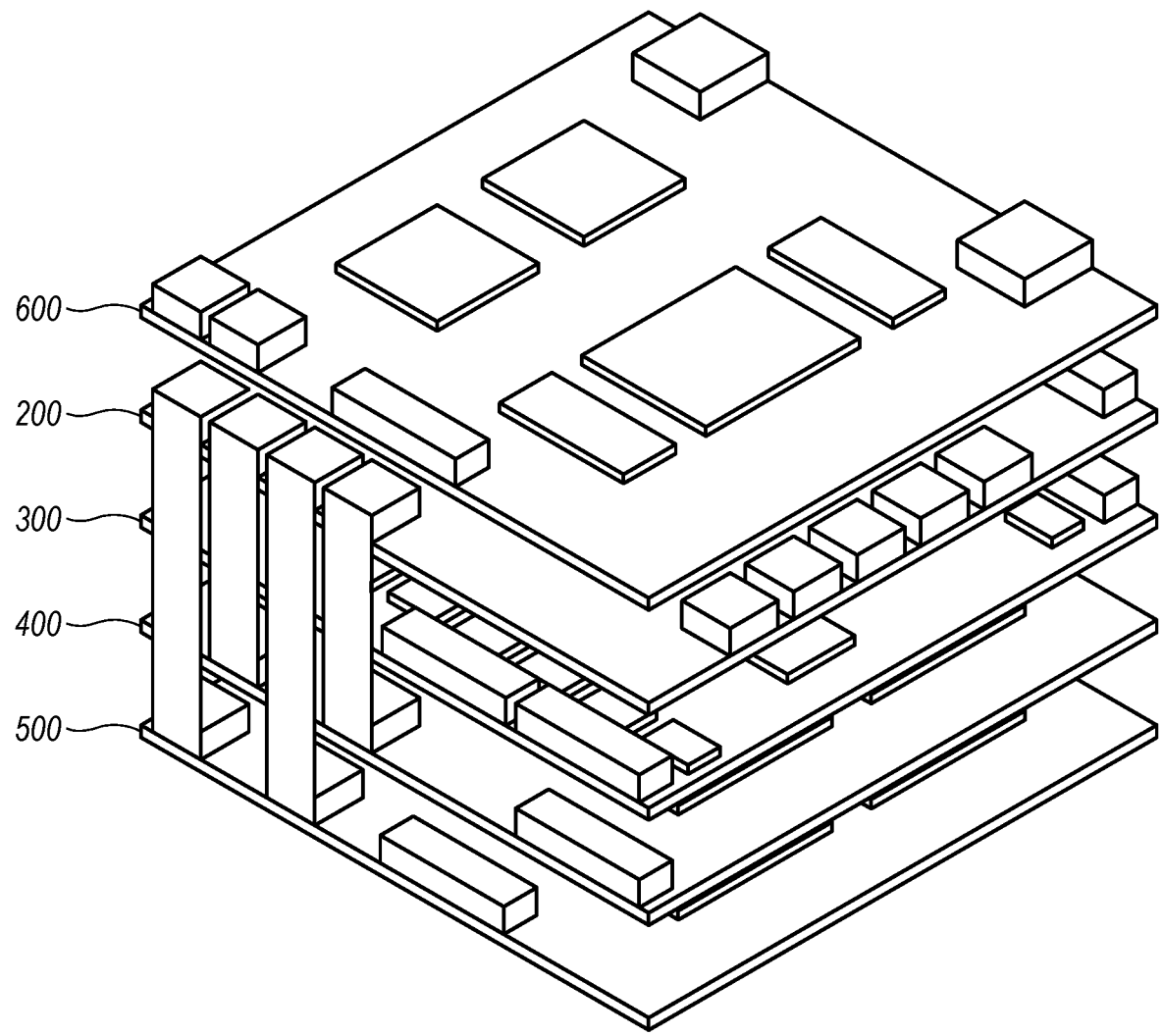
FIG. 2 is a rear perspective view of an embodiment of the present invention.

FIG. 2 depicts a rear perspective view of the invention. FIG. 2 depicts the connections between the power interconnect board 200 and the processor board 300 in greater detail. The first stack connector 201 is electrically connected to the third stack connector 301, and the second stack connector 202 is electrically connected to the fourth stack connector 302. These connections can serve as power interconnects and interconnects between the various ports and power connections on the power interconnect board 200 and the components on the processor board 300.

Figure 3:
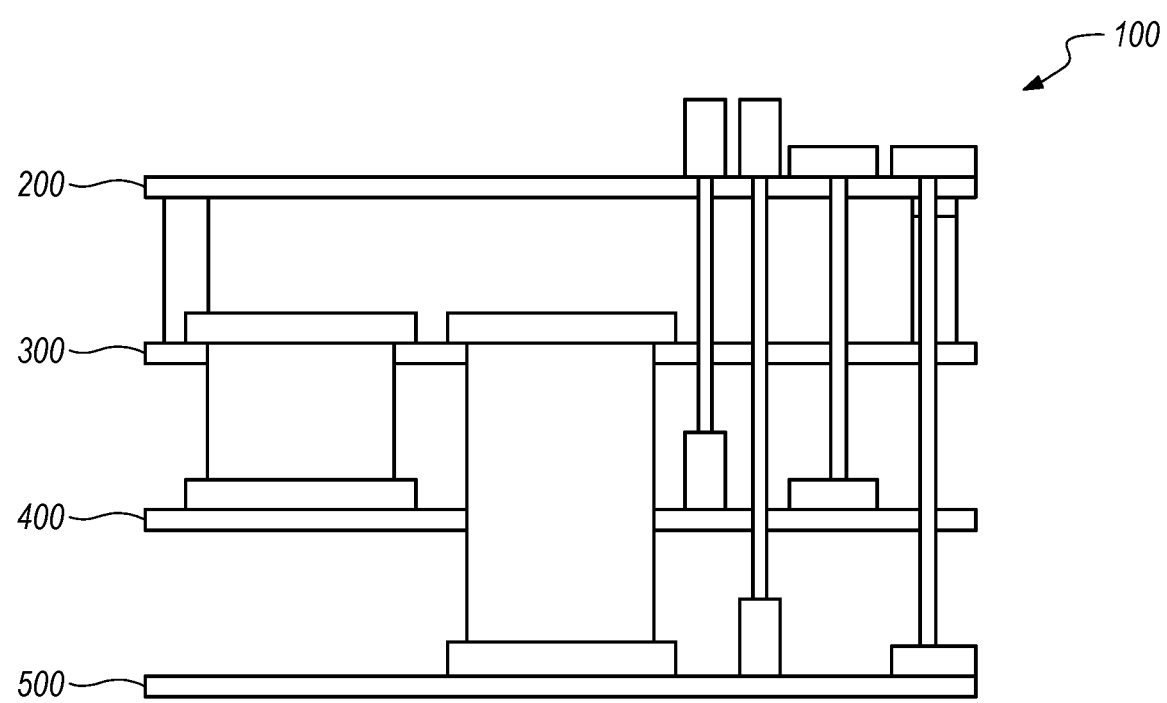
FIG. 3 is a front elevation view of an embodiment of the present invention.

FIG. 3 depicts a front elevation view of the invention. FIG. 3 shows the electrical connections between the first acoustic signal and control bus 320 and the second acoustic signal and control bus 407, the electrical connection between the first antenna signal and control bus 321 and the second antenna signal and control bus 508, the electrical connection between the first power connector 211 and the third power connector 408, the electrical connection between the second power connector 212 and the fourth power connector 509, the electrical connection between the first acoustic transmitter connector 213 and the second acoustic transmitter connector 409, and the electrical connection between the first antenna connector 214 and the second antenna connector 510 in greater detail.

Figure 9:
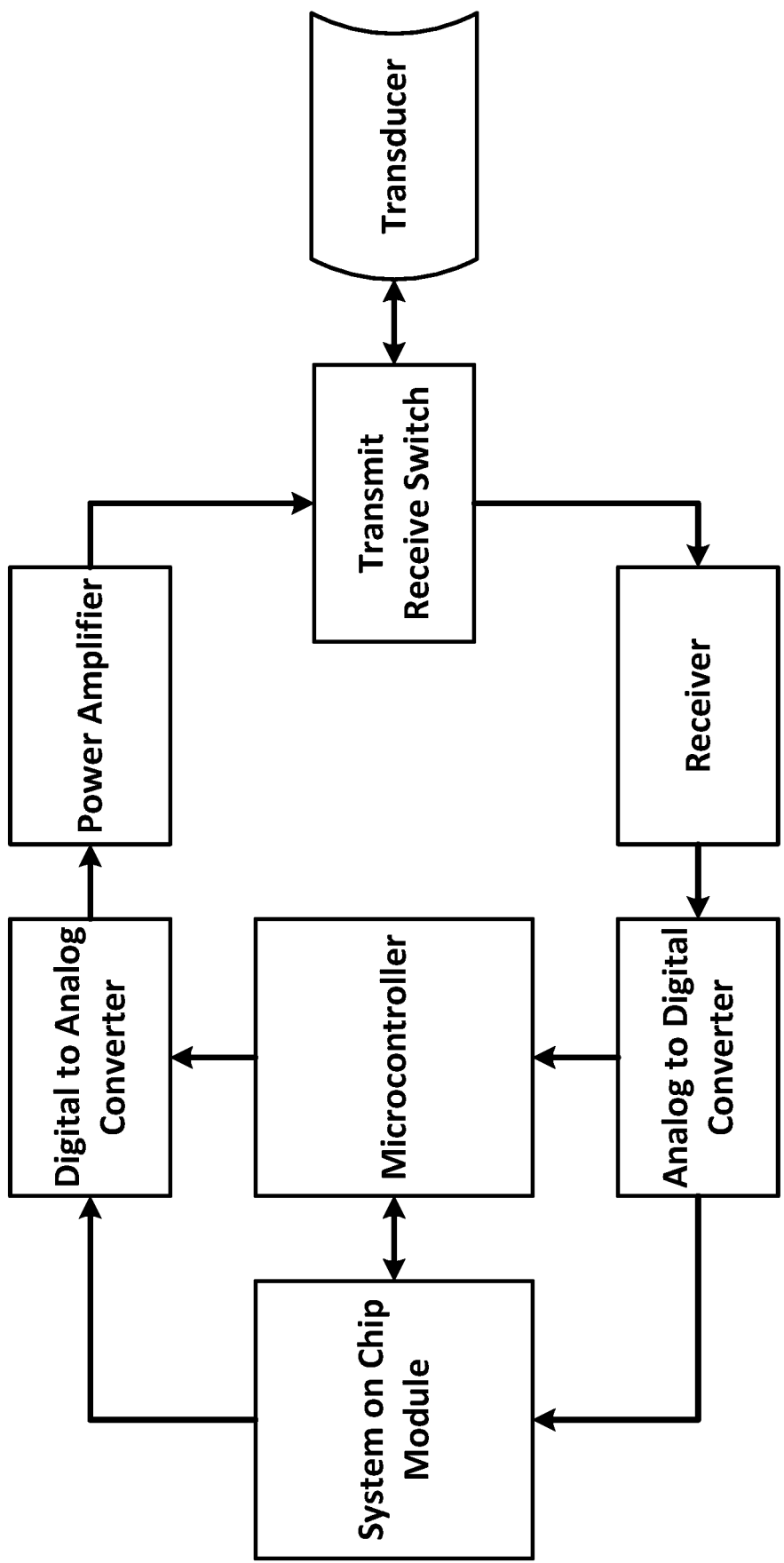
FIG. 9 is a diagram showing the interaction between a transducer and the components of an embodiment of the present invention.

FIG. 9 depicts a high level diagram showing the interaction between a transducer and components of the present invention. In an example of acoustic communications, an acoustic signal from the transducer is sent to t transmit receive switch, a receiver, then to the microcontroller 313 and system on chip module 310. These modules process the received signal. An acoustic transmission signal may be generated at the system on chip module 310 and microcontroller 313, sent to a digital to analog converter, a power amplifier, and a transmit receive switch, which then sends the powered signal through the transducer as an audio signal.

Figure 10:
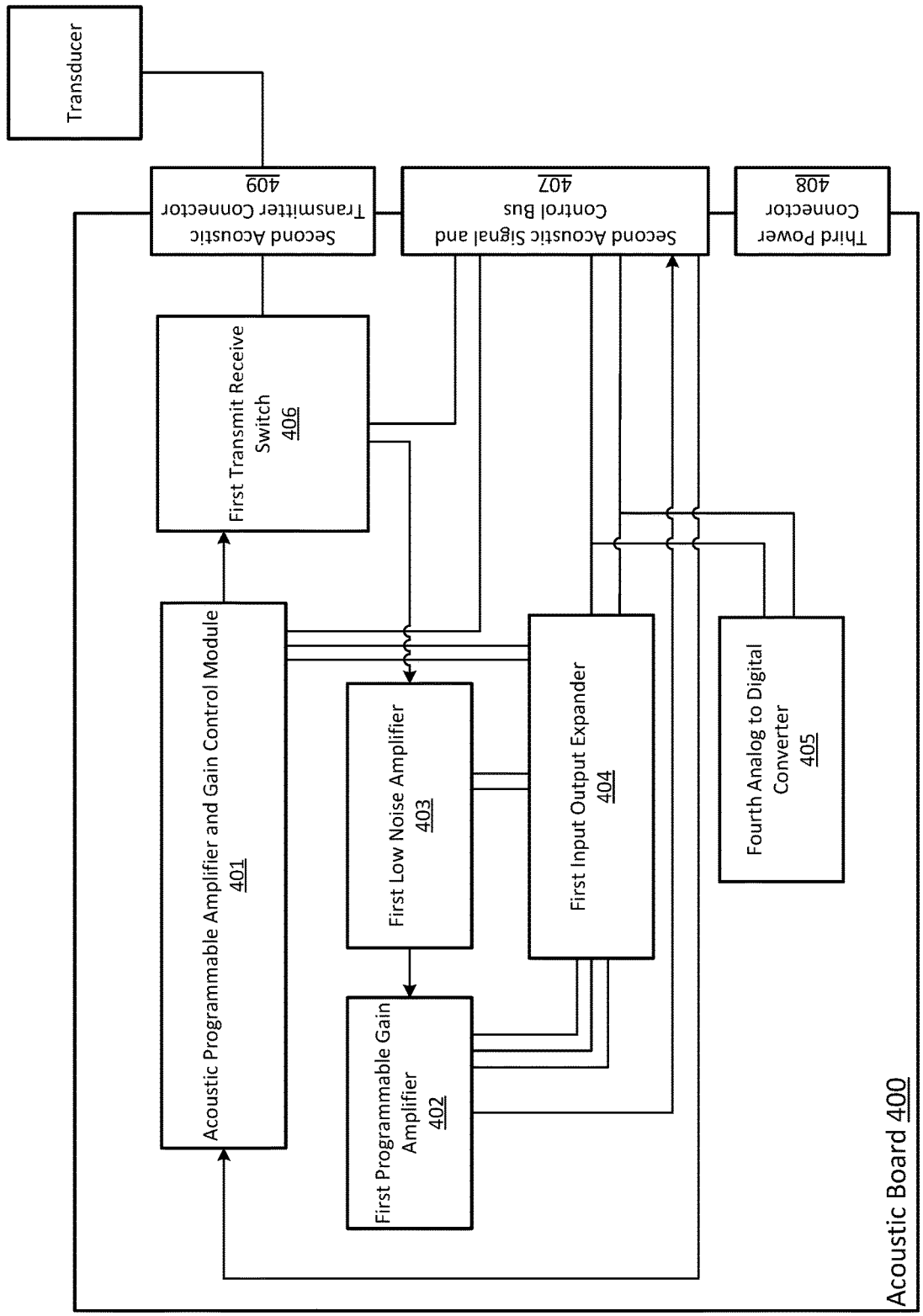
FIG. 10 is a diagram showing the connections between components of an acoustic board according to one embodiment of the present invention.

FIG. 10 depicts the electrical connections between components of the acoustic board 400 in greater detail.

Figure 11:
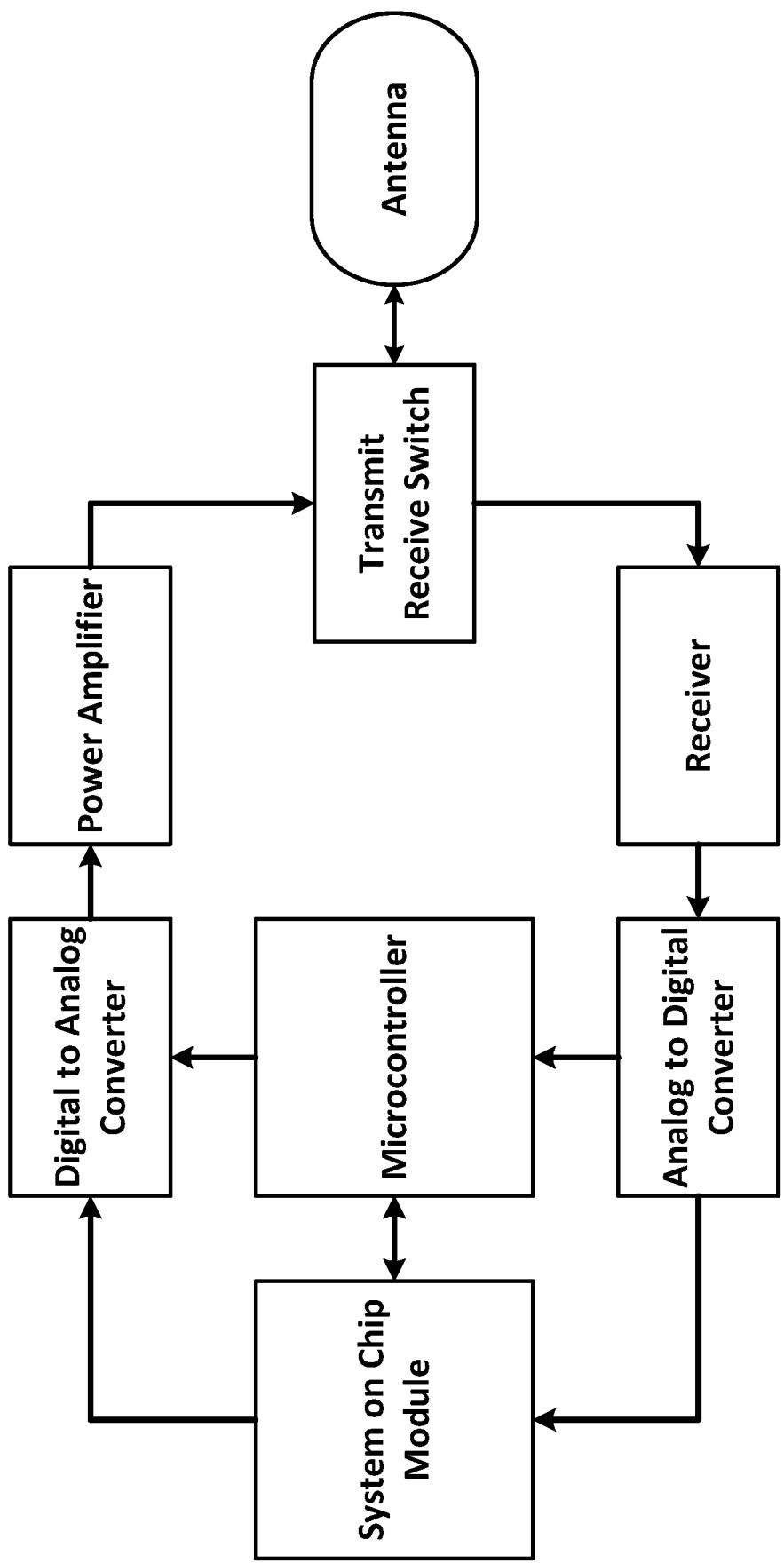
FIG. 11 is a diagram showing the interaction between an antenna and the components of an embodiment of the present invention.

FIG. 11 depicts a high level diagram showing the interaction between an RF antenna and components of the present invention. An RF antenna receiving a signal sends the signal to a transmit receive switch, which then sends the signal to a receiver and an analog to digital converter. The analog to digital converter sends the signal to the microcontroller 313 and system on chip module 310. The transmission path begins at the system on chip module 310 and microcontroller 313. These components generate a transmission signal, which is sent to a digital to analog converter. The digital to analog converter then sends the signal to a power amplifier, which sends the signal to a transmit receive switch. The signal is then transmitted through the antenna.

Figure 12:
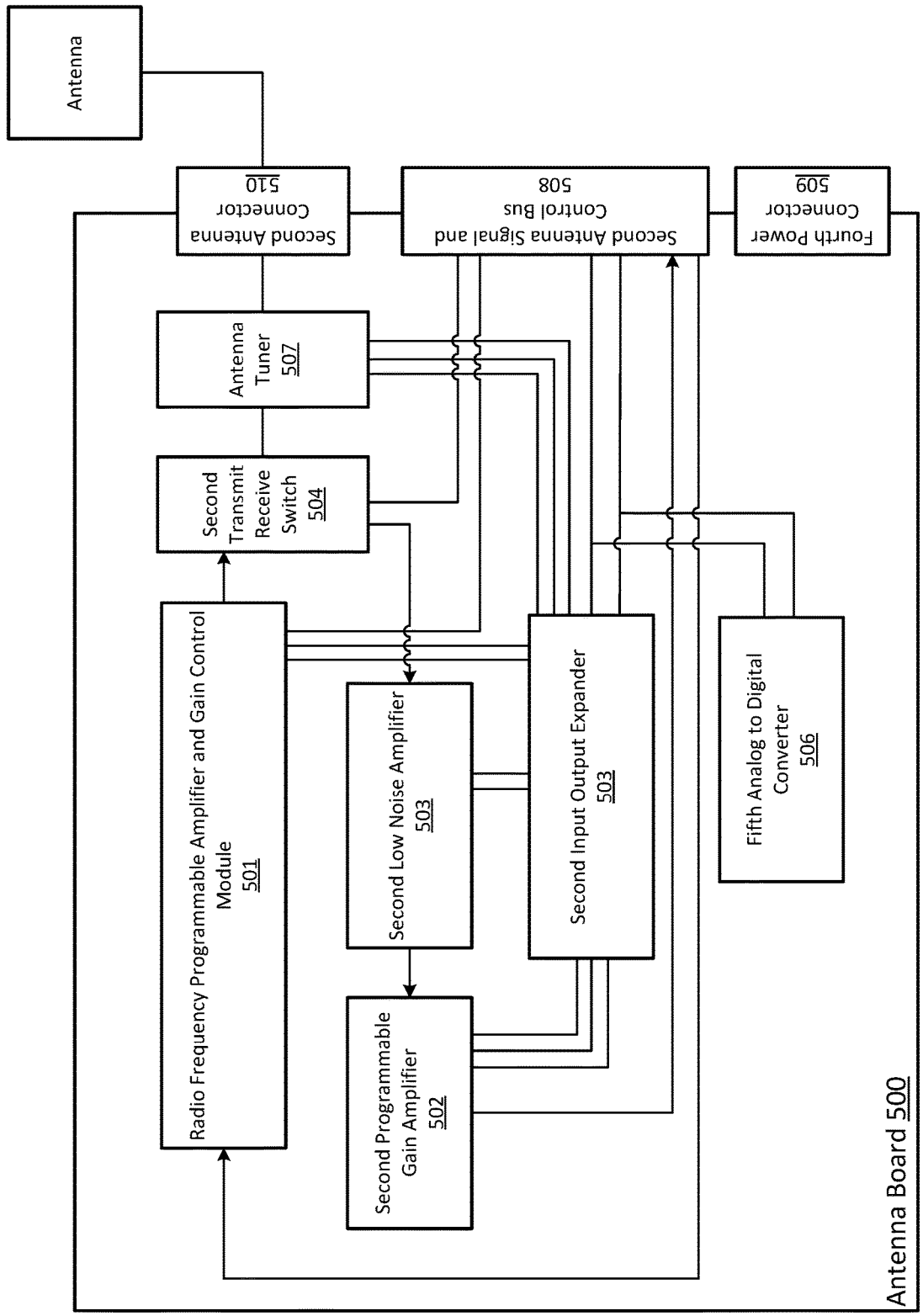
FIG. 12 is a diagram showing the connections between components of an radio frequency board according to one embodiment of the present invention.

FIG. 12 depicts the electrical connections between components of the radio frequency board 500 in greater detail.

Figure 13:
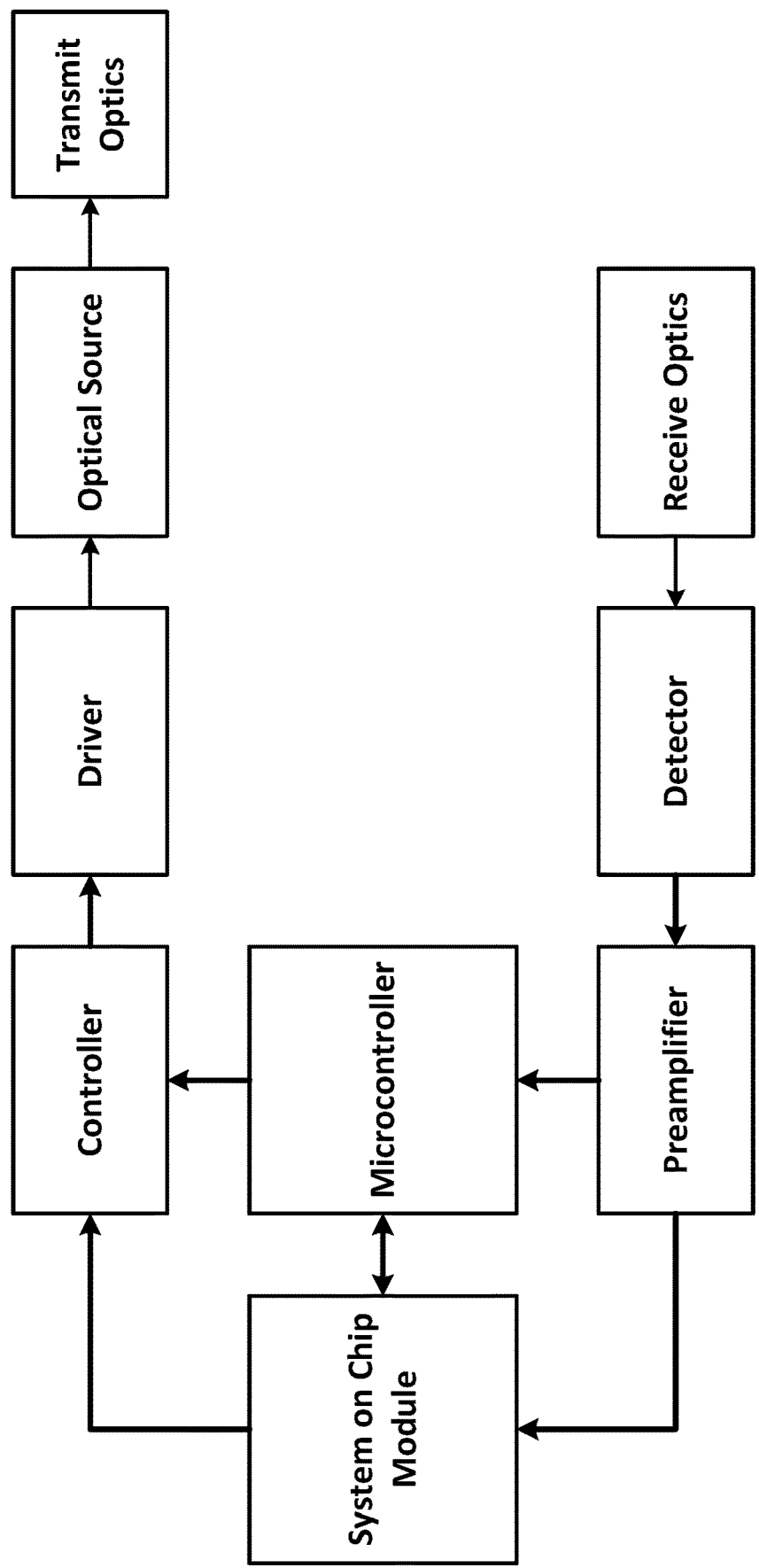
FIG. 13 is a diagram showing the interaction between the transmit and receive optics and the components of an embodiment of the present invention.

FIG. 13 depicts a high level diagram showing the optical signal transmission and reception paths. An optical signal is received at the receive optics (the photodiode 602). This signal is sent to the detector, a preamplifier, then to the microcontroller 313 and system on chip module 310. The transmission path for a signal to be sent at the light emitting diode 601 originates at the system on chip module 310 and microcontroller 313. The signal is sent to a controller. The signal is sent from the controller to a driver, and then on to the optical source and transmit optics (light emitting diode 601).

Figure 14:
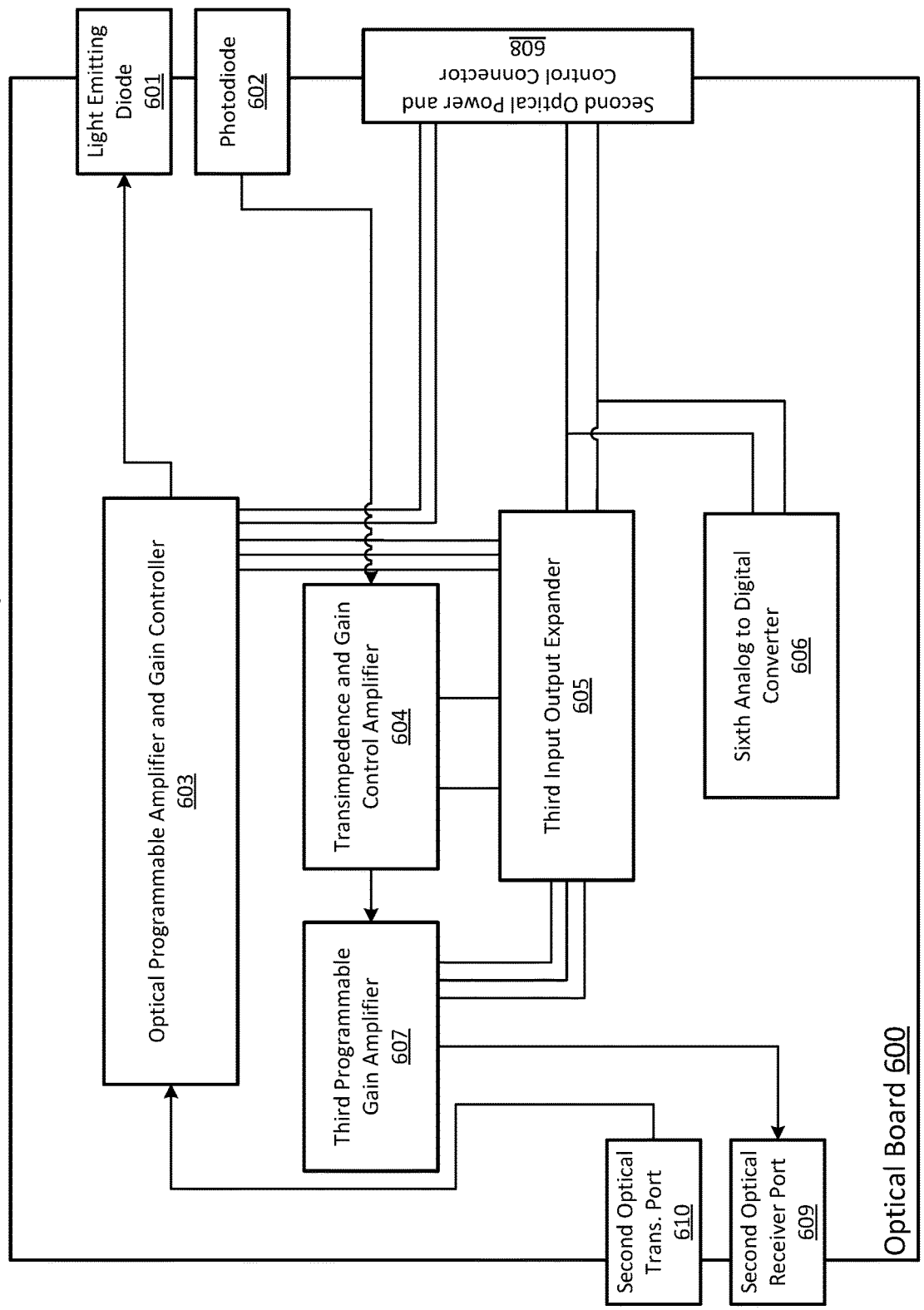
FIG. 14 is a diagram showing the connections between the components of an optical board according to one embodiment of the present invention.

FIG. 14 depicts the electrical connections between components of the optical board 600 in greater detail.

One of the features of the device for communications 100 is its ability to support multiple modalities, including but not limited to acoustics, free-space optics, and radio-frequency. To address requirements for using the device for communications 100 on unmanned platforms, power consumption of the device will be limited. The microcontroller 313 is able to control the power sent to different sectors of the device for communications 100 and turn them on or off as necessary. The size of the device for communications 100 may be tailored to fit both small unmanned underwater vehicles and gliders. Because the device for communications 100 is modular, it may be easily tailored for specific requirements. For example, if only optical communications are desired, the acoustic board 400 and radio frequency board 500 may be removed, allowing for the optimization of the device for communications 100 for bulk and weight when deployed as a vehicular payload.

The system on chip module 310 is an integrated circuit which integrates all of the components of a computer or other electronics system on a single chip. This module is useful in an embedded application due to its low power consumption. The system on chip module 310 may contain digital, analog, mixed-signal, and radio-frequency functions on a single chip substrate. The system on chip module 310 may serve as the main device for communications 100 controller, regulating the device's functions as a modem, performing digital signal processing functions, interpreting commands, performing error correction, modulating data, demodulating data, and compressing data (among other functions).

The microcontroller 313 may be used as a modem controller for the device for communications 100. The microcontroller 313 can interpret some commands and perform some digital signal processing tasks. The microcontroller 313 controls the processor board 300 and initializes components upon reception of a wakeup signal. The microcontroller 313 can also be used to monitor the health of the device for communications 100 and to facilitate connection to environmental sensors. A power distribution unit can be used to control power to the boards. Various boards may be shut down if they are not in use.

Overall connectivity may include (but is not limited to) Ethernet, Wi-Fi, and Bluetooth to facilitate user interaction, command and control, and data exchange. Inclusion of a Universal Serial Bus facilitates connection with external peripheral devices and extra storage devices. A Universal Asynchronous Receiver Transmitter (UART) facilitates connection with devices which may be used to debug or program the device for communications 100. An RS-232 port facilitates connection with serial devices. Additional input-output expansion headers may allow for future improvements and additions by the user.

A serial ATA (SATA) connection will allow for addition of devices such as solid state drives (SSDs) for long-term missions during which large amounts of data are required. A microSD (uSD) slot may be available for running most of the modem functions, and may be the main storage device containing the operating system and user files. A read-only memory (ROM) may be used to store the system on chip module 310 programmable files for successful boot. Random access memory (RAM) will be used for program instructions and to increase the general speed of the system. A BIOS battery will be used to allow the device for communications 100 to retain its settings after disconnecting it from power. Sensors may provide inputs such as current, voltage, pressure, humidity, and temperature are examples of inputs that can be provided to the microcontroller 313. An oscillator can provide a constant clocking input to the device for communications 100. Alternatively, a chip scale atomic clock can be used for synchronization in a multi-nodal environment, as well as assisting navigational calculations in GPS-contested environments. Time inputs are examples of external inputs which may be integrated with the device for communications 100.

From the above description of the present invention, it is manifest that various techniques may be used for implementing its concepts without departing from the scope of the claims. The described embodiments are to be considered in all respects as illustrative and not restrictive. The method disclosed herein may be practiced in the absence of any element that is not specifically claimed and/or disclosed herein. It should also be understood that the present invention is not limited to the particular embodiments described herein, but is capable of being practiced in many embodiments without departure from the scope of the claims.

What is claimed is:

1. A device for communications comprising:
   a power interconnect board electrically connected to a processor board;
   an acoustic board electrically connected to said processor board;
   an radio frequency board electrically connected to the processor board; and
   an optical board electrically connected to said power interconnect board.

2. The device of claim 1, wherein the power interconnect board further comprises a first optical power and control connector, a first optical receiver port, a first optical transmitter port, a first stack connector, a second stack connector, a first power connector, a second power connector, a first acoustic transmitter connector, and a first antenna connector.

3. The device of claim 2, wherein the processor board further comprises a third stack connector, a fourth stack connector, a first acoustic signal and control bus, and a first antenna signal and control bus.

4. The device of claim 3, wherein the acoustic board further comprises a second acoustic signal and control bus, a third power connector, and a second acoustic transmitter connector.

5. The device of claim 4, wherein the radio frequency board further comprises a second signal and control bus, a fourth power connector, and a second antenna connector.

6. The device of claim 5, wherein the optical board further comprises a second optical power and control connector, a second optical receiver port, and a second optical transmitter port.

7. The device of claim 6, wherein the first stack connector is electrically connected to the third stack connector, the fourth stack connector is electrically connected to the second stack connector.

8. The device of claim 6, wherein the first power connector is electrically connected to the third power connector, the second power connector is electrically connected to the fourth power connector, the first acoustic transmitter connector is electrically connected to the second acoustic transmitter connector, the first antenna connector is electrically connected to the second antenna collector.

9. The device of claim 6, wherein the first optical power and control connector is electrically connected to the second optical power and control connector, the first optical receiver port is electrically connected to the second optical receiver port, the first optical transmitter port is electrically connected to the second optical transmitter port.

10. A device for communications comprising:
a power interconnect board comprising a first optical power and control connector, a first optical receiver port, a first optical transmitter port, a first stack connector, a second stack connector, a first power connector, a second power connector, a first acoustic transmitter connector, a first antenna connector;
a processor board comprising a third stack connector, a fourth stack connector, a first acoustic signal and control bus, a first antenna signal and control bus;
an acoustic board comprising a second acoustic signal and control bus, a third power connector, a second acoustic transmitter connector;
an radio frequency board comprising a second antenna signal and control bus, a fourth power connector, a second antenna connector;
an optical board comprising a second optical power and control connector, a second optical receiver port, a second optical transmitter port;
wherein the first stack connector is electrically connected to the third stack connector, the fourth stack connector is electrically connected to the second stack connector;
wherein the first power connector is electrically connected to the third power connector, the second power connector is electrically connected to the fourth power connector, the first acoustic transmitter connector is electrically connected to the second acoustic transmitter connector, the first antenna connector is electrically connected to the second antenna collector; and
wherein the first optical power and control connector is electrically connected to the second optical power and control connector, the first optical receiver port is electrically connected to the second optical receiver port, the first optical transmitter port is electrically connected to the second optical transmitter port.

11. The device of claim 10, wherein the processor board further comprises a system on chip module and a microcontroller.

12. The device of claim 10, wherein the acoustic board further comprises an acoustic programmable amplifier and gain control module, a first programmable gain amplifier, a first low noise amplifier, a first input output expander, a fourth analog to digital converter, and a first transmit receive switch.

13. The device of claim 10, wherein the radio frequency board further comprises a radio frequency programmable amplifier and gain control module, a second programmable gain amplifier, a second low noise amplifier, a second transmit receive switch, a second input output expander, a fifth analog to digital converter, and a frequency tuner.

14. The device of claim 10, wherein the optical board further comprises a light emitting diode, a photodiode, an optical programmable amplifier and gain controller, a transimpedence and gain control amplifier, a third input output expander, a sixth analog to digital converter, and a third programmable gain amplifier.

15. A device for communications comprising:
a power interconnect board comprising a first optical power and control connector, a first optical receiver port, a first optical transmitter port, a first stack connector, a second stack connector, a first power connector, a second power connector, a first acoustic transmitter connector, a first antenna connector;
a processor board comprising a third stack connector, a fourth stack connector, a first acoustic signal and control bus, a first antenna signal and control bus, a system on chip module, a microcontroller;
an acoustic board comprising a second acoustic signal and control bus, a third power connector, a second acoustic transmitter connector, an acoustic programmable amplifier and gain control module, a first programmable gain amplifier, a first low noise amplifier, a first input output expander, a fourth analog to digital converter, a first transmit receive switch;
an radio frequency board comprising a second antenna signal and control bus, a fourth power connector, a second antenna connector, a radio frequency programmable amplifier and gain control module, a second programmable gain amplifier, a second low noise amplifier, a second transmit receive switch, a second input output expander, a fifth analog to digital converter, a frequency tuner;
an optical board comprising a second optical power and control connector, a second optical receiver port, a second optical transmitter port, a light emitting diode, a photodiode, an optical programmable amplifier and gain controller, a transimpedence and gain control amplifier, a third input output expander, a sixth analog to digital converter, a third programmable gain amplifier;
wherein the first stack connector is electrically connected to the third stack connector, the fourth stack connector is electrically connected to the second stack connector;
wherein the first power connector is electrically connected to the third power connector, the second power connector is electrically connected to the fourth power connector, the first acoustic transmitter connector is electrically connected to the second acoustic transmitter connector, the first antenna connector is electrically connected to the second antenna collector; and
wherein the first optical power and control connector is electrically connected to the second optical power and control connector, the first optical receiver port is electrically connected to the second optical receiver port, the first optical transmitter port is electrically connected to the second optical transmitter port.

16. The device of claim 15, wherein the first transmit receive switch is electrically connected to the acoustic programmable amplifier and gain control module, the first low noise amplifier, the second acoustic signal and control bus, and the second acoustic transmitter connector.

17. The device of claim 15, wherein the second transmit receive switch is electrically connected to the radio frequency programmable amplifier and gain control module, the second low noise amplifier, frequency tuner, and second antenna signal and control bus.

18. The device of claim 17, wherein the frequency tuner is electrically connected to the second antenna connector.

19. The device of claim 15, wherein the optical programmable amplifier and gain controller is electrically connected to the second optical transmit port and the light emitting diode.

20. The device of claim 19, wherein the transimpedence gain control amplifier is connected to the photodiode and the third programmable gain amplifier.

\* \* \* \* \*